US007683469B2

(12) United States Patent
Oh et al.

(10) Patent No.: US 7,683,469 B2

(45) Date of Patent: Mar. 23, 2010

(54) PACKAGE-ON-PACKAGE SYSTEM WITH HEAT SPREADER

(75) Inventors: JiHoon Oh, Icheon-si (KR); KyuWon Lee, Ansung-Si (KR); Jaehyun Lim, Seoul (KR); JongVin Park, Seoul (KR); SinJae Lee, Icheon-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/131,038

(22) Filed: May 30, 2008

(65) Prior Publication Data

US 2009/0294941 A1 Dec. 3, 2009

(51) Int. Cl.

| | |
|---|---|
| ***H01L 23/02*** | (2006.01) |
| ***H01L 23/495*** | (2006.01) |
| ***H01L 23/10*** | (2006.01) |
| ***H01L 23/34*** | (2006.01) |
| ***H01L 23/48*** | (2006.01) |
| ***H01L 23/52*** | (2006.01) |
| ***H01L 29/40*** | (2006.01) |

(52) U.S. Cl. ....................... 257/686; 257/675; 257/706; 257/707; 257/712; 257/713; 257/719; 257/723; 257/726; 257/777; 257/778; 257/E23.051; 257/E23.08; 257/E23.085; 257/E23.101; 257/E23.102

(58) Field of Classification Search ................. 257/675, 257/686, 706–707, 712–713, 719, 723, 726, 257/777–778, E23.051, E23.08, E23.085, 257/E23.101, E23.102

See application file for complete search history.

(56) References Cited

U.S. PATENT DOCUMENTS

| | | | | |
|---|---|---|---|---|
| 6,979,891 | B2 * | 12/2005 | Wood et al. | 257/679 |
| 7,032,392 | B2 * | 4/2006 | Koeneman et al. | 62/77 |
| 7,235,880 | B2 * | 6/2007 | Prokofiev | 257/734 |
| 7,288,835 | B2 * | 10/2007 | Yim et al. | 257/685 |
| 7,304,381 | B2 | 12/2007 | Rumer et al. | |
| 7,327,025 | B2 | 2/2008 | Shim et al. | |
| 7,327,028 | B2 | 2/2008 | Chiu | |
| 7,361,986 | B2 | 4/2008 | Yuan et al. | |
| 7,364,946 | B2 | 4/2008 | Karnezos | |
| 7,372,141 | B2 * | 5/2008 | Karnezos et al. | 257/686 |
| 7,429,787 | B2 * | 9/2008 | Karnezos et al. | 257/686 |
| 7,445,962 | B2 * | 11/2008 | Choi et al. | 438/109 |
| 2004/0262372 | A1 * | 12/2004 | Houle et al. | 228/246 |
| 2006/0118927 | A1 * | 6/2006 | Verma et al. | 257/676 |
| 2006/0138631 | A1 * | 6/2006 | Tao et al. | 257/686 |
| 2008/0136006 | A1 * | 6/2008 | Jang et al. | 257/686 |
| 2008/0136007 | A1 * | 6/2008 | Kim et al. | 257/686 |
| 2009/0057881 | A1 * | 3/2009 | Arana et al. | 257/714 |
| 2009/0152547 | A1 * | 6/2009 | Park et al. | 257/48 |

* cited by examiner

*Primary Examiner*—Ida M Soward

(74) *Attorney, Agent, or Firm*—Mikio Ishimaru

(57) ABSTRACT

A package-on-package system includes: providing a base substrate; mounting an integrated circuit on the base substrate; positioning a stacking interposer over the integrated circuit; and forming a heat spreader base around the integrated circuit by coupling the base substrate and the stacking interposer to the heat spreader base.

20 Claims, 6 Drawing Sheets

PACKAGE-ON-PACKAGE SYSTEM WITH HEAT SPREADER

TECHNICAL FIELD

The present invention relates generally to integrated circuit packaging, and more particularly to a system for assembling a package-on-package.

BACKGROUND ART

Portable electronic products such as mobile phones, mobile computing, and various consumer products require higher semiconductor functionality and performance in a limited footprint and minimal thickness and weight at the lowest cost. This has driven the industry to increase integration on the individual semiconductor chips.

In order to increase the functional density in integrated circuit devices, companies have begun implementing integration on the "z-axis," that is, by stacking chips, and stacks of up to five chips in one package have been used. This provides a dense chip structure having the footprint of a one-chip package, in the range of 25 square mm to 1600 square mm, and obtaining thicknesses that have been continuously decreasing from 2.3 mm to 0.5 mm. The cost of a stacked die package is only incrementally higher than the cost of a single die package and the assembly yields are high enough to assure a competitive final cost as compared to packaging the die in individual packages.

The primary practical limitation to the number of chips that can be stacked in a stacked die package is the low final test yield of the stacked-die package. It is inevitable that some of the die in the package will be defective to some extent, and therefore the final package test yield will be the product of the individual die test yields, each of which is always less than 100%. This can be particularly a problem even if only two die are stacked in a package but one of them has low yield because of design complexity or technology.

Another limitation is the power dissipation of the package. The heat is transmitted from one die to the other and there is no significant dissipation path other than through the solder ball to the motherboard. The increased heat in the package can significantly reduce the life of the chips in the package. This is a significant problem whether several die are stacked in a single package or several packages are stacked in a single structure. Stacked packages can provide numerous advantages as compared to stacked-die packages. For instance, each package with its die can be electrically tested, and rejected unless it shows satisfactory performance, before the packages are stacked. As a result the final stacked multi-package module yields can be maximized.

A further limitation is electromagnetic interference between the stacked die, particularly between RF and digital die, because there is no electrical shielding of either die. This issue becomes significant in small consumer electronic devices, such as cell phones or global positioning systems.

More efficient cooling can be provided in stacked packages, by inserting a heat spreader between the packages in the stack as well as at the top of the module. These additional components in the manufacturing stack add another level of complexity to the package assembly process and may reduce the manufacturing yield somewhat.

Thus, a need still remains for a package-on-package system with heat spreader that can increase the package reliability by removing excess heat without adding burdensome manufacturing processes. In view of the increasing demand for Internet connected devices and cell phones, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a package-on-package system including: providing a base substrate; mounting an integrated circuit on the base substrate; positioning a stacking interposer over the integrated circuit; and forming a heat spreader base around the integrated circuit by coupling the base substrate and the stacking interposer to the heat spreader base.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
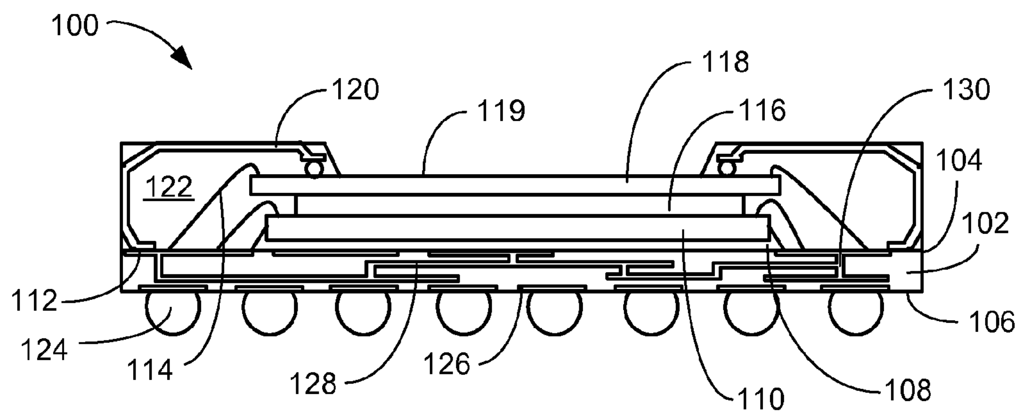
FIG. 1 is a cross-sectional view along the section line 1-1 of FIG. 12 of a package-on-package system with heat spreader, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Figure 12:
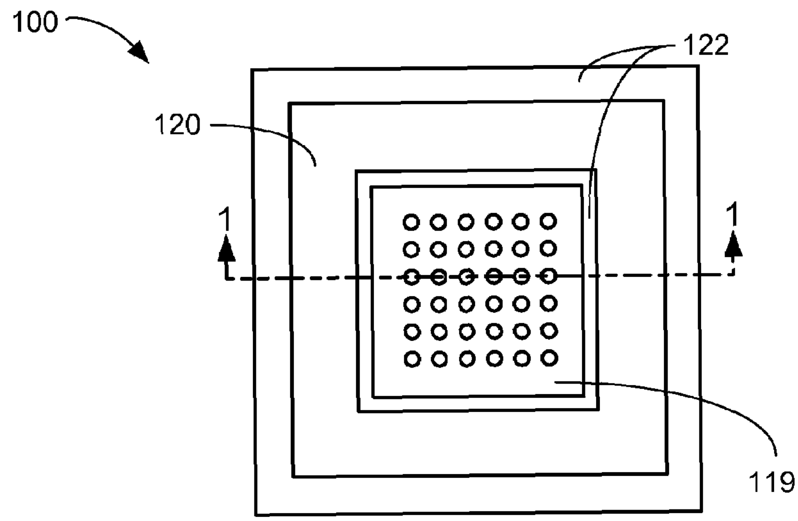
FIG. 12 is a top view of a package-on-package system with heat spreader in an embodiment of the present invention.

Referring now to FIG. 1, therein is shown a cross-sectional view along the section line 1-1 of FIG. 12 of a package-on-package system 100 with heat spreader, in an embodiment of the present invention. The cross-sectional view along the section line 1-1 of FIG. 12 of the package-on-package system 100 depicts a base substrate 102 having a component side 104 and a system side 106. An adhesive 108, such as a die attach material, may be used to mount an integrated circuit 110 to the component side 104.

A component contact 112 on the component side 104 of the base substrate 102 may be coupled to the integrated circuit 110 by electrical interconnects 114. A spacer 116, such as a silicon spacer, may be positioned between the integrated circuit 110 and a stacking interposer 118. The stacking interposer 118 may be coupled to the component contact 112 by the electrical interconnects 114. The stacking interposer 118 may also contain a contiguous ground plane.

A heat spreader base 120 may be formed around the stacking interposer 118, the integrated circuit 110, and the electrical interconnects 114. The heat spreader base 120 may be electrically connected, such as by solder, to the stacking interposer 118 and the component contact 112 on the base substrate 102. A supply voltage, such as ground, may be applied to the component contact 112 that is electrically connected to the heat spreader base 120. By attaching the heat spreader base 120 to the supply voltage, the heat spreader base may also act as an electromagnetic interference (EMI) shield that may block radio frequency interference (RFI).

It has been discovered that by forming the heat spreader base 120 so that it surrounds the integrated circuit 110 and is coupled to the base substrate 102 as well as the stacking interposer 118, the heat spreader base 120 may conduct heat away from the integrated circuit 110 and the base substrate 102 while actively shielding against EMI and RFI. By reducing the operating temperature of the integrated circuit 110, its useable life may be extended.

A base package body 122 may be formed by injecting a molding compound on the component side 104 of the base substrate 102, the integrated circuit 110, the electrical interconnects 114, and the stacking interposer 118. The lateral sides and top surface of the heat spreader base 120 as well as a top contact surface 119 of the stacking interposer 118 may remain exposed to on the surface of the base package body 122. The exposed area of the heat spreader base 120 may radiate excess heat to the ambient air by convection.

System interconnects 124 may be coupled to system contacts 126 on the system side 106 of the base substrate 102. By coupling specific units of the system interconnects 124 to the supply voltage, the supply voltage will be coupled through an inner layer 128 by a via 130 to the specific units of the component contact 112 that may also be coupled to the heat spreader base 120.

Figure 2:
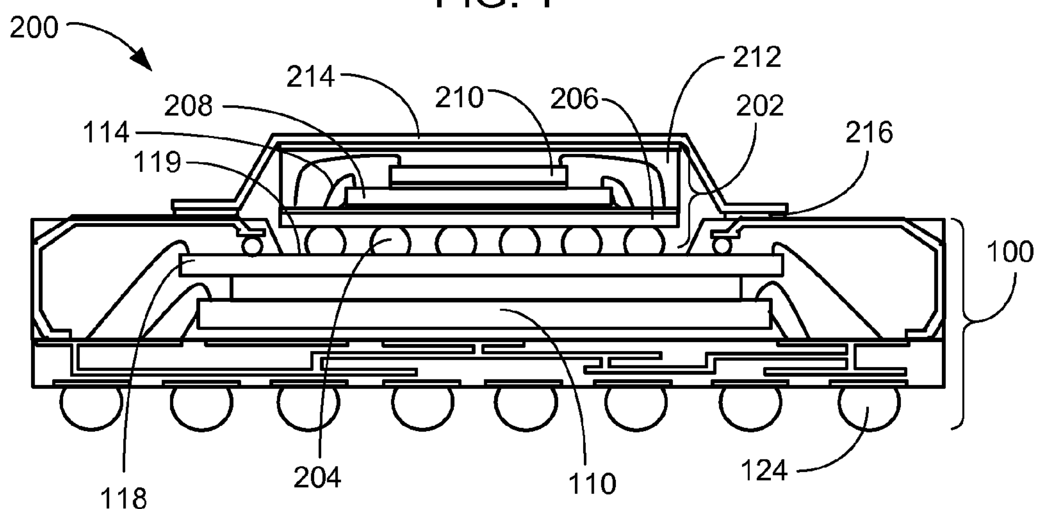
FIG. 2 is a cross-sectional view similar to FIG. 1 of a package-on-package stack with heat spreader, in an alternative embodiment of the present invention.

Referring now to FIG. 2, therein is shown a cross-sectional view similar to FIG. 1 of a package-on-package stack 200 with heat spreader, in an alternative embodiment of the present invention. The cross-sectional view similar to FIG. 1 of the package-on-package stack 200 depicts the package-on-package system 100 having a top package 202 mounted thereon. The top package 202 may be coupled to the top contact surface 119 of the stacking interposer 118 by chip interconnects 204.

The top package 202 may have a substrate 206 with a first integrated circuit 208 mounted thereon. A second integrated circuit 210 may be mounted on the active surface of the first integrated circuit 208. Both the first integrated circuit 208 and the second integrated circuit 210 may be electrically connected, by the electrical interconnects 114, to the chip interconnects 204 through the substrate 206. A top package body 212 may be formed by forming a molding compound on the substrate 206, the first integrated circuit 208, the second integrated circuit 210, and the electrical interconnects 114.

With the top package 202 mounted on the package-on-package system 100 an electrical connection may be formed between the integrated circuit 110, the first integrated circuit 208, the second integrated circuit 210, the system interconnects 124, or a combination thereof. A heat spreader cover 214 may be mounted over the top package and thermally coupled to both the top package 202 and the heat spreader base 120 by a thermal adhesive 216, such as a thermal epoxy, solder, or a combination thereof.

It has been discovered that the addition of the heat spreader cover 214 to the package-on-package system 100 may provide additional surface area for transferring heat out of the package-on-package stack 200. If the heat spreader cover 214 is electrically connected to the heat spreader base 120, it may also act as an EMI/RFI shield for the top package 202.

The structure of the top package 202 is an example only and any configuration of the first integrated circuit 208 may be used. As well, the top package 202 is displayed as a ball grid array, but it could also be a quad flatpack no-lead (QFN), a plastic leaded chip carrier (PLCC), or other leaded integrated circuit package.

Figure 3:
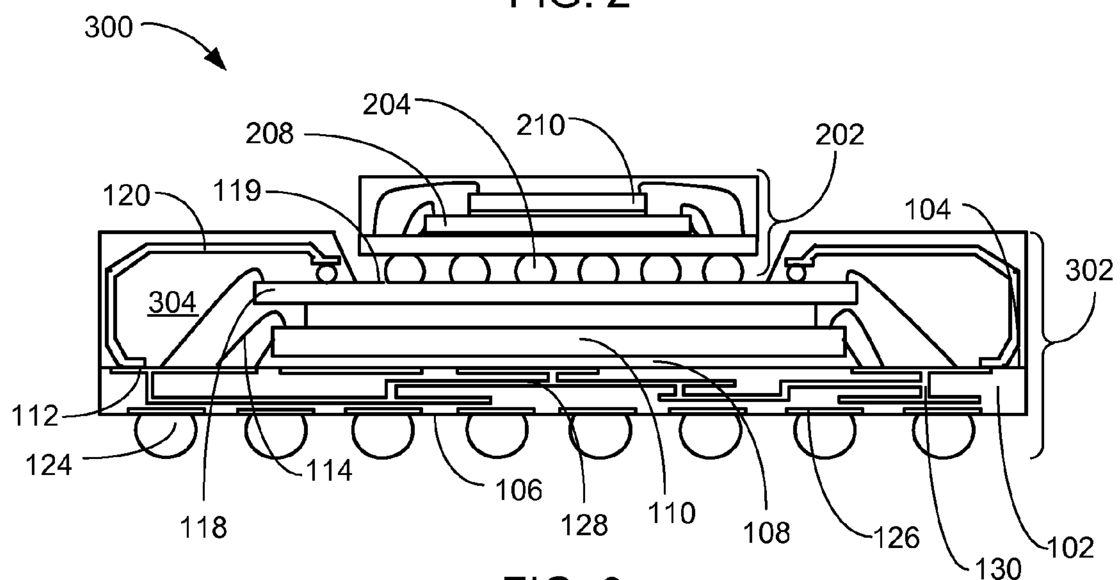
FIG. 3 is a cross-sectional view similar to FIG. 1 of a package-on-package stack with heat spreader, in a second alternative embodiment of the present invention.

Referring now to FIG. 3, therein is shown a cross-sectional view similar to FIG. 1 of a package-on-package stack 300 with heat spreader, in a second alternative embodiment of the present invention. The cross-sectional view similar to FIG. 1 of the package-on-package stack 300 depicts a package-on-package system 302 having the top package 202 mounted thereon. The top package 202 may be coupled to the top contact surface 119 of the stacking interposer 118 by the chip interconnects 204.

The package-on-package system 302 may have the base substrate 102 having the component side 104 and the system side 106. The adhesive 108 may be used to mount the integrated circuit 110 to the component side 104.

The component contact 112 on the component side 104 of the base substrate 102 may be coupled to the integrated circuit 110 by the electrical interconnects 114. The spacer 116 may be positioned between the integrated circuit 110 and the stacking interposer 118. The stacking interposer 118 may be coupled to the component contact 112 by the electrical interconnects 114. The stacking interposer 118 may also contain a contiguous ground plane.

The heat spreader base 120 may be formed around the stacking interposer 118, the integrated circuit 110, and the electrical interconnects 114. The heat spreader base 120 may be electrically connected, such as by solder, to the stacking interposer 118 and the component contact 112 on the base substrate 102. The supply voltage, such as ground, may be applied to the component contact 112 that is electrically connected to the heat spreader base 120. By attaching the heat spreader base 120 to the supply voltage, the heat spreader base may also act as an electromagnetic interference (EMI) shield that may block radio frequency interference (RFI).

It has been discovered that by forming the heat spreader base 120 so that it surrounds the integrated circuit 110 and is coupled to the base substrate 102 as well as the stacking interposer 118, the heat spreader base 120 may provide shielding against EMI and RFI.

A base package body 304 may be formed by injecting a molding compound on the component side 104 of the base substrate 102, the integrated circuit 110, the electrical interconnects 114, the stacking interposer 118, and the heat spreader base 120. The heat spreader base 120 may be completely encased by the base package body 304, while the top contact surface 119 of the stacking interposer 118 remains exposed.

The system interconnects 124 may be coupled to the system contacts 126 on the system side 106 of the base substrate 102. By coupling specific units of the system interconnects 124 to the supply voltage, the supply voltage will be coupled through the inner layer 128 by the via 130 to the specific units of the component contact 112 that may also be coupled to the heat spreader base 120.

Figure 4:
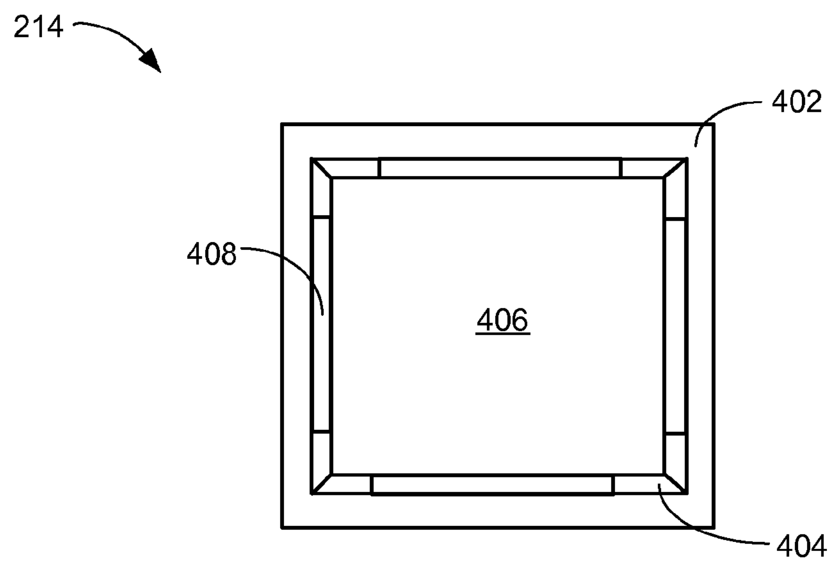
FIG. 4 is a top view of the heat spreader cover of FIG. 2.

Referring now to FIG. 4, therein is shown a top view of the heat spreader cover 214 of FIG. 2. The top view of the heat spreader cover 214 depicts a flange 402 which may be used to thermally and electrically connect the heat spreader cover 214 to the heat spreader base 120, of FIG. 1. Shaped corner risers 404 may be formed at each of the corners of the flange 402 in order to support a top package contact 406. The top package contact 406 is formed substantially parallel to the plane of the flange 402. An air gap 408 may be provided to allow air to pass beneath the heat spreader cover 214 when it is installed over the top package 202, of FIG. 2.

The heat spreader cover 214 may be formed of an electrically and thermally conductive material, such as a metal. The size of the heat spreader cover 214 may be sufficient to match the exposed surface area of the heat spreader base 120 on at least all of the corners of the flange 402.

Figure 5:
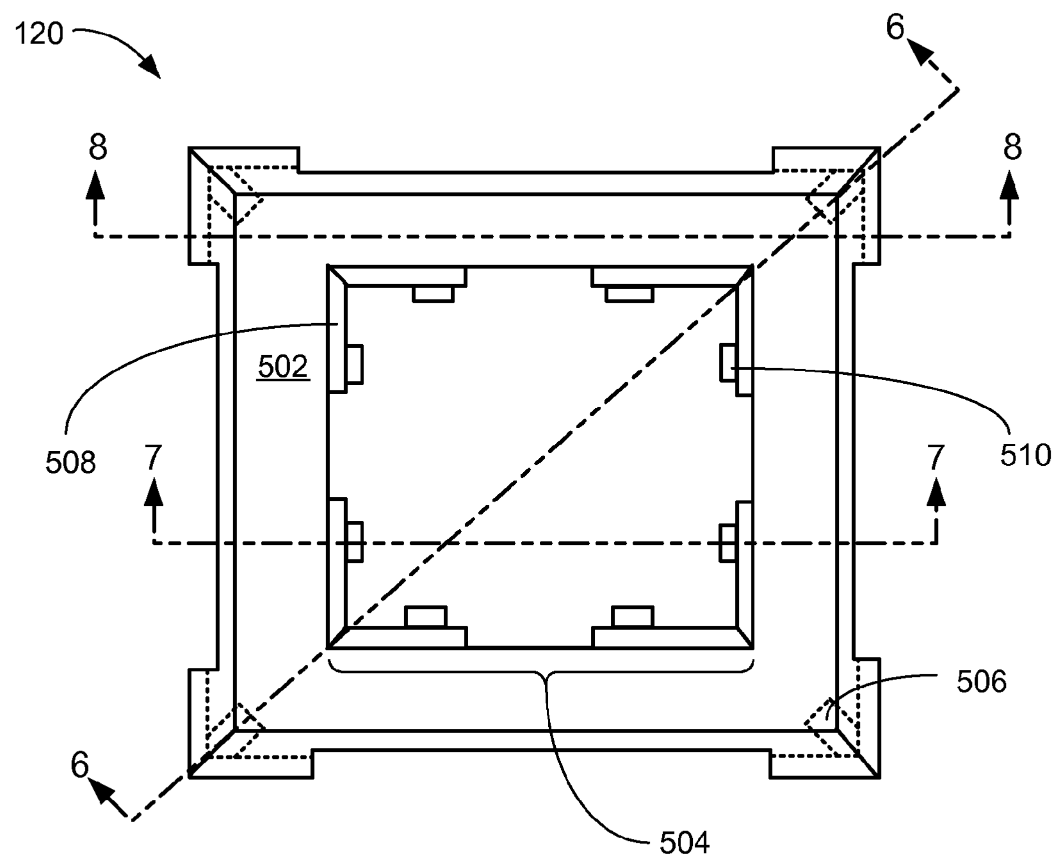
FIG. 5 is a plan view of the heat spreader base of FIG. 1.

Referring now to FIG. 5, therein is shown a top plan view of the heat spreader base 120 of FIG. 1. The top plan view of the heat spreader base 120 depicts a top surface contact 502 formed in a substantially rectangular shape around an integrated circuit well 504. The integrated circuit well may be of sufficient size to allow the top package 202, of FIG. 2, to be positioned for attachment to the stacking interposer 118, of FIG. 1.

Base substrate contacts 506 may be formed below the top surface contact 502 and may be coplanar with each other and substantially parallel to the top surface contact 502. Support members 508 may be formed within the integrated circuit well 504 at a level below the top surface contact 502. The support members 508 are coplanar with each other and parallel with the top surface contact 502. The support members 508 may be positioned at a level between the top surface contact 502 and the base substrate contacts 506. Interposer contacts 510 may protrude from the support members 508. The interposer contacts 510 may be electrically connected to the stacking interposer 118, of FIG. 1, for forming the EMI/RFI shield.

Figure 6:
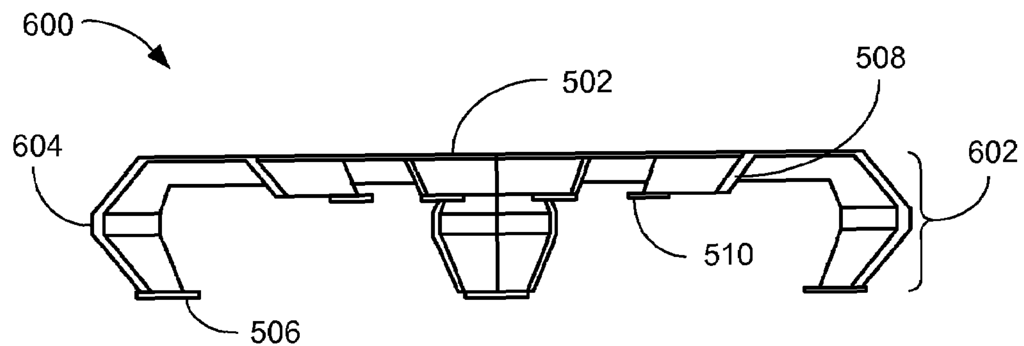
FIG. 6 is a cross-sectional view of the heat spreader base of FIG. 5 along the section line 6-6.

A section line 6-6 may show the cut and viewing direction of FIG. 6. A section line 7-7 may show the cut and viewing direction of FIG. 7. A section line 8-8 may show the cut and viewing direction of FIG. 8.

Referring now to FIG. 6, therein is shown a cross-sectional view of the heat spreader base 120 of FIG. 5 along the section line 6-6. The cross-sectional view of the heat spreader base 120 depicts the top surface contact 502 at the top of the structure. A formed corner support 602 may define the vertical distance between the top surface contact 502 and the base substrate contact 506. A lateral side 604 of the formed corner support 602 may remain exposed during the formation of the base package body 122, of FIG. 1. The size and position of the lateral side 604 is an example only and the actual size and position may differ.

The support members 508 may establish the vertical distance of the interposer contacts 510 from the top surface contact 502 and the base substrate contact 506. It has been discovered that the shape of the formed corner support 602 may provide a mechanism to allow the lateral side 604 to be exposed from the base package body 122, of FIG. 1, while allowing sufficient corner clearance to form a solid package structure around the lateral side 604.

Figure 7:
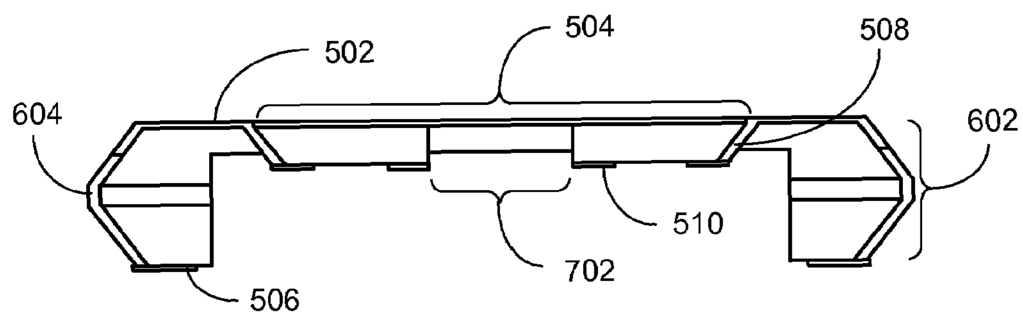
FIG. 7 is a cross-sectional view of the heat spreader base of FIG. 5 along the section line 7-7.

Referring now to FIG. 7, therein is shown a cross-sectional view of the heat spreader base 120 of FIG. 5 along the section line 7-7. The cross-sectional view of the heat spreader base 120 depicts the top surface contact 502 at the top of the structure. The formed corner support 602 may define the vertical distance between the top surface contact 502 and the base substrate contact 506. The lateral side 604 of the formed corner support 602 may remain exposed during the formation of the base package body 122, of FIG. 1. The size and position of the lateral side 604 is an example only and the actual size and position may differ.

The support members 508 may establish the vertical distance of the interposer contacts 510 from the top surface contact 502 and the base substrate contact 506. It has been discovered that the shape of the formed corner support 602 may provide a mechanism to provide the lateral side 604 to be exposed from the base package body 122, of FIG. 1, while allowing sufficient corner clearance to form a solid package structure around the lateral side 604. A molding gap 702 may be formed between the support members 508 on each side of the integrated circuit well 504. The molding gap 702 may provide sufficient space to assure the molding compound used to form the base package body 122 can flow over the support members 508.

Figure 8:
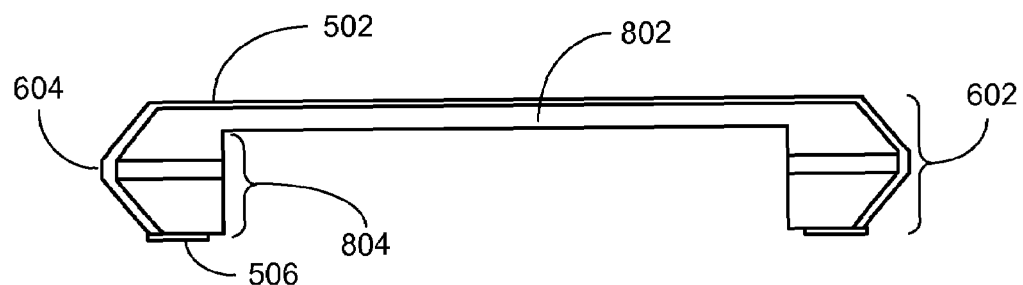
FIG. 8 is a cross-sectional view of the heat spreader base of FIG. 5 along the section line 8-8.

Referring now to FIG. 8, therein is shown a cross-sectional view of the heat spreader base 120 of FIG. 5 along the section line 8-8. The cross-sectional view of the heat spreader base 120 depicts the top surface contact 502 at the top of the structure. The formed corner support 602 may define the vertical distance between the top surface contact 502 and the base substrate contact 506. The lateral side 604 of the formed corner support 602 may remain exposed during the formation of the base package body 122, of FIG. 1. The size and position of the lateral side 604 is an example only and the actual size and position may differ.

A stiffener 802 may extend between each of the formed corner supports 602. The stiffener 802 may assure that the top contact surface 502 remains planar during handling and installation. A window opening height 804 may vary depending on the specific application being packaged. In an application where the heat spreader base 120 is operating as an EMI/RFI shield, the window opening height 804 may be much smaller. In this example the stiffener 802 may extend below the lateral side 604 in order to maximize the shielding effect.

Figure 9:
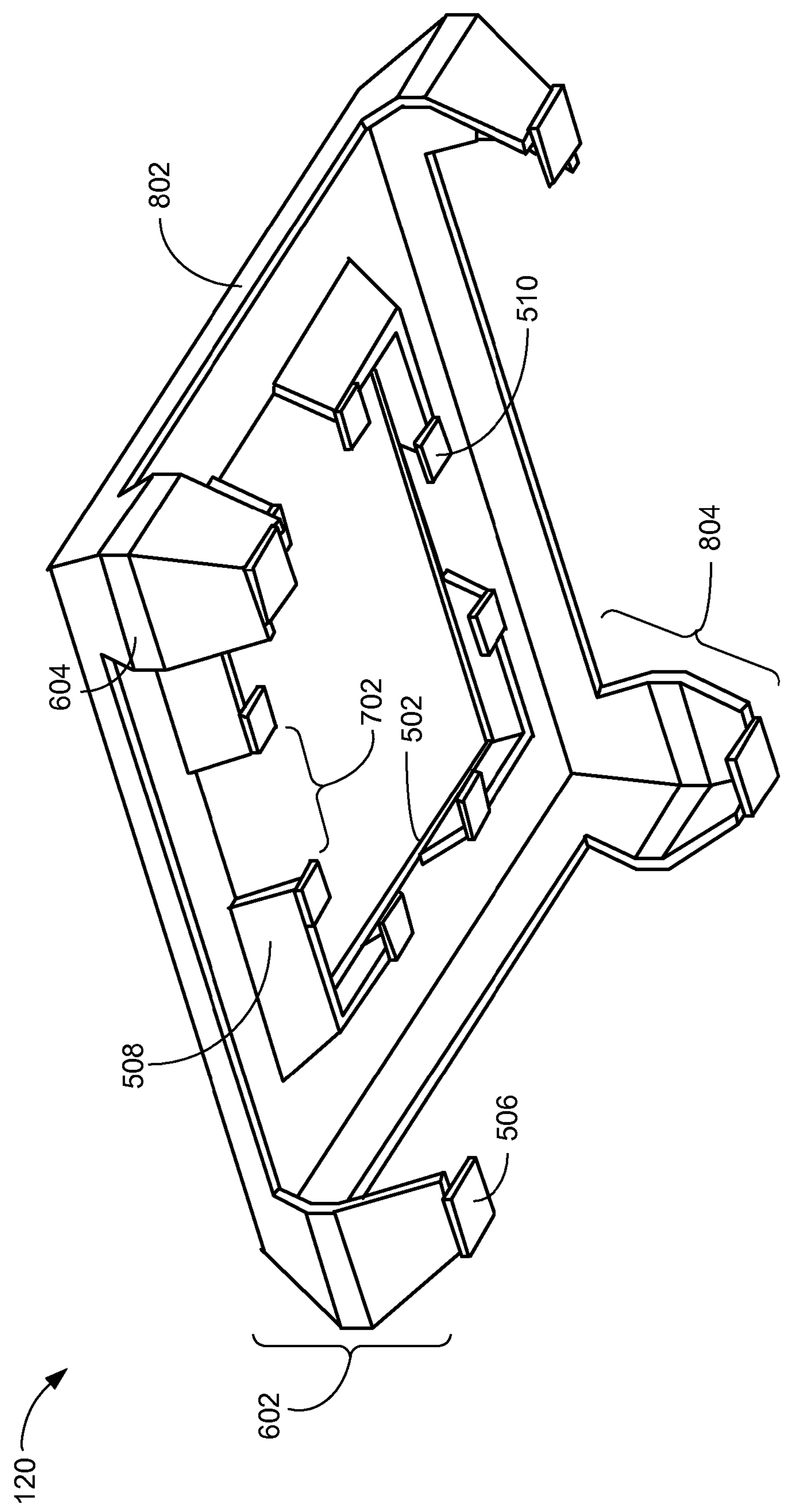
FIG. 9 is an isometric view of the heat spreader base of FIG. 1 as viewed from the bottom.

Referring now to FIG. 9, therein is shown an isometric view of the heat spreader base 120 of FIG. 1 as viewed from the bottom. The isometric view of the heat spreader base 120 depicts the formed corner support 602 which may define the vertical distance between the top surface contact 502 and the base substrate contact 506. The lateral side 604 of the formed corner support 602 may remain exposed during the formation of the base package body 122, of FIG. 1. The size and position of the lateral side 604 is an example only and the actual size and position may differ.

The molding gap 702 may be formed between the support members 508. The molding gap 702 may provide sufficient space to assure the molding compound used to form the base package body 122 can flow over the support members 508 during the forming of the base package body 122.

The stiffener 802 may extend between each of the formed corner supports 602. The stiffener 802 may assure that the top contact surface 502 remains planar during handling and installation. The window opening height 804 may vary depending on the specific application being packaged. In an application where the heat spreader base 120 is operating as an EMI/RFI shield, the window opening height 804 may be much smaller. In this example the stiffener 802 may extend below the lateral side 604 in order to maximize the shielding effect.

Figure 10:
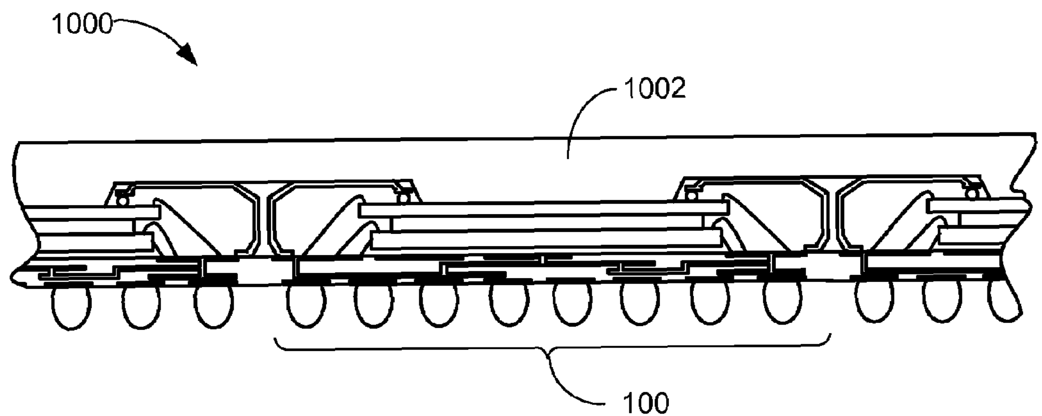
FIG. 10 is a cross-sectional view similar to FIG. 1 of a package-on-package system with heat spreader, in a molding phase of manufacture.

Referring now to FIG. 10, therein is shown a cross-sectional view similar to FIG. 1 of a package-on-package system 1000 with heat spreader, in a molding phase of manufacture. The cross-sectional view similar to FIG. 1 of the package-on-package system 1000 depicts a series of the package-on-package system 100 under pressure of a mold chase 1002. The mold chase 1002 may form an array of the package-on-package system 100 in a single operation. When the base package body 122 has been formed on the array, the mold chase 1002 may be removed.

Figure 11:
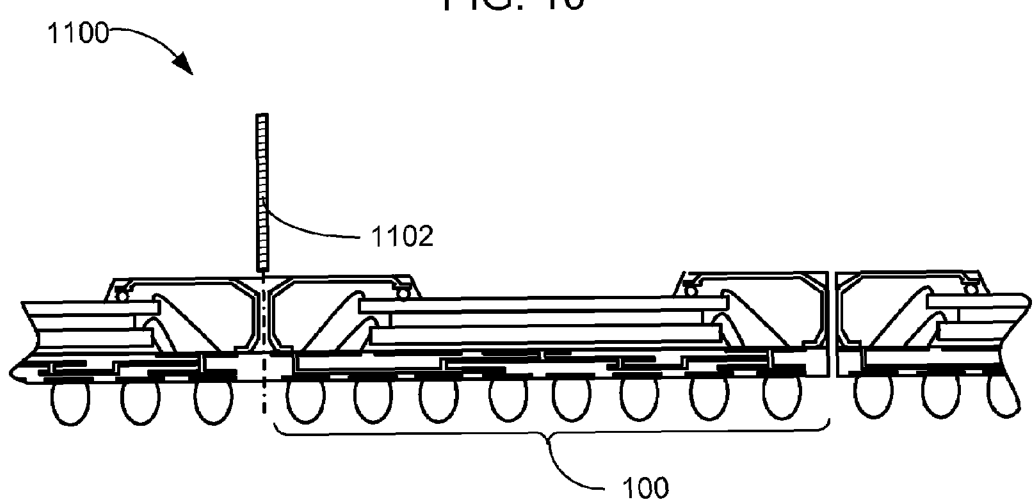
FIG. 11 is a cross-sectional view similar to FIG. 1 of the package-on-package assembly in a singulation phase of manufacturing.

Referring now to FIG. 11, therein is shown a cross-sectional view similar to FIG. 1 of the package-on-package system 100 in a singulation phase of manufacturing. The cross-sectional view similar to FIG. 1 of the package-on-package system 100 depicts the array of the package-on-package system 100. A singulation device 1102, such as a singulation saw, a punch, or a shear, may be used to free the individual pieces of the package-on-package system 100 from the array.

Referring now to FIG. 12, therein is shown a top view of the package-on-package system 100 with heat spreader in an embodiment of the present invention. The top view of the package-on-package system 100 depicts the top contact surface 119 having the base package body 122 on the perimeter. The heat spreader base 120 may be exposed between the base package body 112. A section line 1-1 may depict the position and direction of view of the cross-section of FIG. 1.

Figure 13:
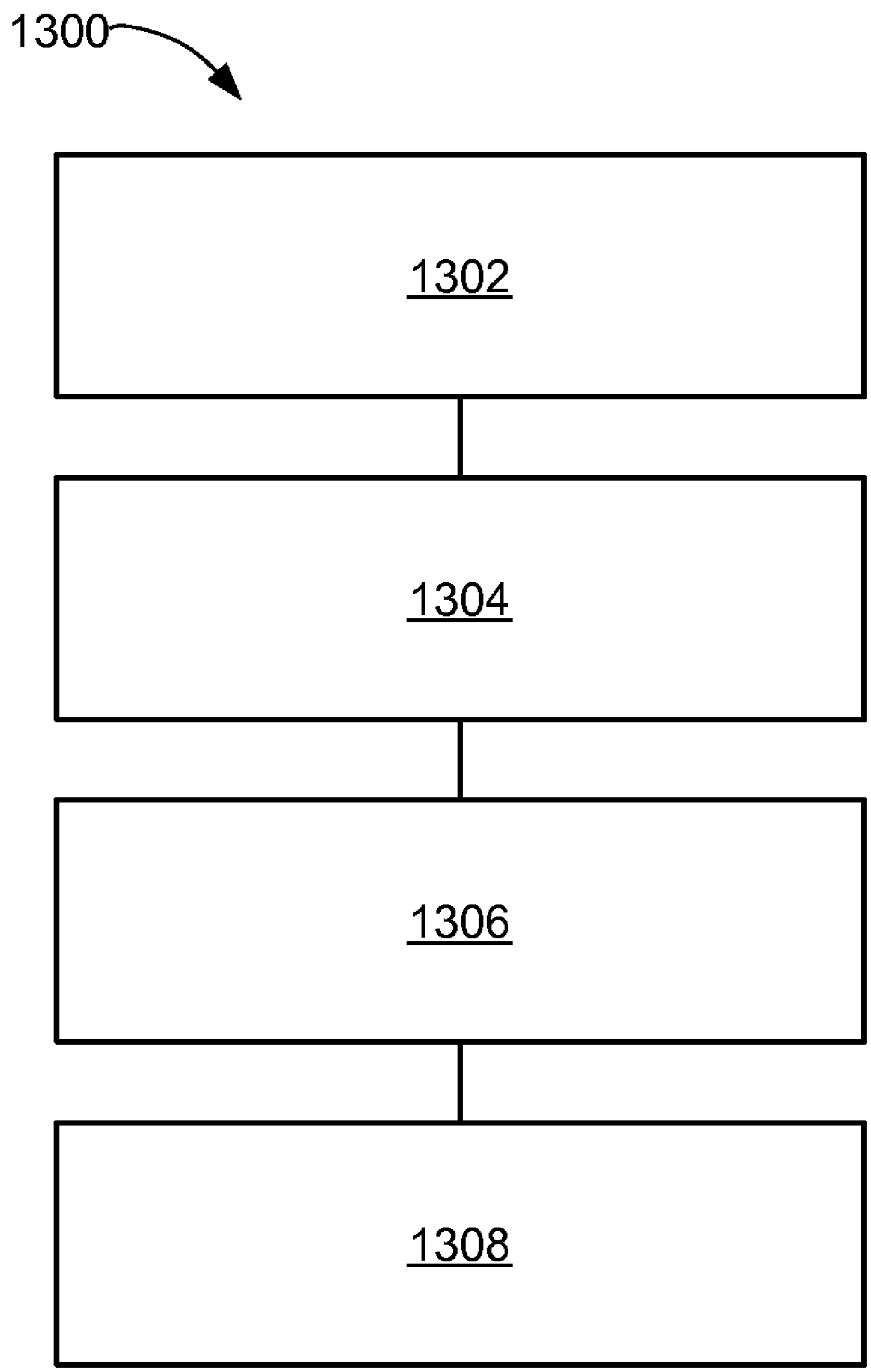
FIG. 13 is a flow chart of a package-on-package system for manufacturing the package-on-package system with heat spreader in an embodiment of the present invention.

Referring now to FIG. 13, therein is shown a flow chart of a package-on-package system 1300 for manufacturing the package-on-package system 100 with heat spreader in an embodiment of the present invention. The system 1300 includes providing a base substrate in a block 1302; mounting an integrated circuit on the base substrate in a block 1304; positioning a stacking interposer over the integrated circuit in a block 1306; and forming a heat spreader base around the integrated circuit by coupling the base substrate and the stacking interposer to the heat spreader base in a block 1308.

Thus, it has been discovered that the package-on-package system of the present invention furnishes important and heretofore unknown and unavailable solutions, capabilities, and functional aspects for manufacturing a multi-package integration stack. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit devices in stacked package devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A package-on-package system including:

providing a base substrate;

mounting an integrated circuit on the base substrate;

positioning a stacking interposer over the integrated circuit including electrically connecting the stacking interposer to the base substrate; and forming a heat spreader base around the integrated circuit by coupling the base substrate and the stacking interposer to the heat spreader base.

2. The system as claimed in claim 1 further comprising forming a base package body by injecting a molding compound on the base substrate, the integrated circuit, the heat spreader base, and the stacking interposer.

3. The system as claimed in claim 1 wherein forming the heat spreader base around the integrated circuit including fabricating formed corner supports, on the heat spreader base, around the integrated circuit.

4. The system as claimed in claim 1 further comprising forming a base substrate contact on the heat spreader base for coupling the base substrate.

5. The system as claimed in claim 1 further comprising mounting a top package on the stacking interposer for coupling the integrated circuit, the base substrate, or a combination thereof.

6. A package-on-package system including:

providing a base substrate including forming a component contact on a component side coupled to a system interconnect on a system side;

mounting an integrated circuit on the base substrate including coupling an electrical interconnect, a chip interconnect, or a combination thereof between the integrated circuit and the base substrate;

positioning a stacking interposer over the integrated circuit including electrically connecting the stacking interposer to the base substrate; and forming a heat spreader base around the integrated circuit by coupling the base substrate and the stacking interposer to the heat spreader base including forming an electro-magnetic interference shield by coupling a supply voltage to the system interconnect and the component contact to the heat spreader base.

7. The system as claimed in claim 6 further comprising forming a base package body by injecting a molding compound on the base substrate, the integrated circuit, the heat spreader base, and the stacking interposer including exposing a lateral side and a top surface contact for conducting heat away from the integrated circuit.

8. The system as claimed in claim 6 wherein forming the heat spreader base around the integrated circuit including fabricating formed corner supports, on the heat spreader base, around the integrated circuit includes forming a stiffener between the formed corner supports for shielding the integrated circuit.

9. The system as claimed in claim 6 further comprising forming a base substrate contact on the heat spreader base for coupling the base substrate including forming support members having interposer contacts for coupling the stacking interposer.

10. The system as claimed in claim 6 further comprising mounting a top package on the stacking interposer for coupling the integrated circuit, the base substrate, or a combination thereof including forming a heat spreader cover, over the top package, for coupling to the heat spreader base.

11. A package-on-package system including:

a base substrate;

an integrated circuit on the base substrate;

a stacking interposer over the integrated circuit includes the stacking interposer electrically connected to the base substrate; and a heat spreader base around the integrated circuit coupled to the base substrate and the stacking interposer.

12. The system as claimed in claim 11 further comprising a base package body on the base substrate, the integrated circuit, the heat spreader base, and the stacking interposer.

13. The system as claimed in claim 11 wherein the heat spreader base around the integrated circuit has formed corner supports.

14. The system as claimed in claim 11 further comprising a base substrate contact on the heat spreader base coupled to the base substrate.

15. The system as claimed in claim 11 further comprising a top package on the stacking interposer coupled to the integrated circuit, the base substrate, or a combination thereof.

16. The system as claimed in claim 11 further comprising:

a component contact on a component side coupled to a system interconnect on a system side of the base substrate;

an electrical interconnect, a chip interconnect, or a combination thereof between the integrated circuit and the base substrate; and an electro-magnetic interference shield around the integrated circuit by a supply voltage coupled to the system interconnect and the component contact coupled to the heat spreader base.

17. The system as claimed in claim 16 further comprising a base package body on the base substrate, the integrated circuit, the heat spreader base, and the stacking interposer includes a lateral side and a top surface contact exposed for conducting heat away from the integrated circuit.

18. The system as claimed in claim 16 wherein the heat spreader base around the integrated circuit has formed corner supports includes a stiffener between the formed corner supports for shielding the integrated circuit.

19. The system as claimed in claim 16 further comprising a base substrate contact on the heat spreader base coupled to the base substrate and support members with interposer contacts coupled to the stacking interposer.

20. The system as claimed in claim 16 further comprising a top package on the stacking interposer coupled to the integrated circuit, the base substrate, or a combination thereof includes a heat spreader cover, over the top package, coupled to the heat spreader base.

* * * * *